(12) United States Patent  (10) Patent No.: US 8,477,053 B2
Kapusta et al.  (45) Date of Patent: Jul. 2, 2013

(54) ADC WITH RESOLUTION DETECTOR AND VARIABLE DITHER

(75) Inventors: Ronald Kapusta, Bedford, MA (US); Doris Lin, Somerville, MA (US); Yervant Dermenjian, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 48 days.

(21) Appl. No.: 13/299,879

(22) Filed: Nov. 18, 2011

(65) Prior Publication Data

US 2012/0306675 A1  Dec. 6, 2012

Related U.S. Application Data

(60) Provisional application No. 61/493,892, filed on Jun. 6, 2011.

(51) Int. Cl.
*H03M 1/20*  (2006.01)

(52) U.S. Cl.
USPC .......................................... 341/131; 341/155

(58) Field of Classification Search
USPC ........................... 341/131, 155, 158
See application file for complete search history.

(56) References Cited

U.S. PATENT DOCUMENTS

| | | | |
|---|---|---|---|
| 5,877,667 A | 3/1999 | Wollesen | |
| 5,990,815 A * | 11/1999 | Linder et al. | 341/131 |
| 6,229,469 B1 * | 5/2001 | Gaudet | 341/143 |
| 6,303,971 B1 | 10/2001 | Rhee | |
| 7,327,292 B2 * | 2/2008 | Lee et al. | 341/94 |
| 7,788,608 B2 | 8/2010 | Huynh et al. | |
| 7,830,287 B1 * | 11/2010 | Huang | 341/131 |
| 7,876,188 B2 | 1/2011 | Tarng et al. | |
| 2003/0234436 A1 | 12/2003 | Hsu et al. | |
| 2004/0170395 A1 * | 9/2004 | Filippini et al. | 386/111 |
| 2006/0039224 A1 | 2/2006 | Lotfi et al. | |
| 2009/0091414 A1 | 4/2009 | Hopper et al. | |
| 2010/0090875 A1 * | 4/2010 | Kapusta et al. | 341/131 |
| 2010/0164770 A1 * | 7/2010 | Wan et al. | 341/133 |
| 2010/0201553 A1 * | 8/2010 | Huang | 341/131 |

OTHER PUBLICATIONS

PCT International Search Report and Written Opinion from PCT/US2012/046458, mailed on Sep. 18, 2012.

* cited by examiner

*Primary Examiner* — Howard Williams
(74) *Attorney, Agent, or Firm* — Kenyon & Kenyon LLP

(57) ABSTRACT

A resolution detector may be used in conjunction with an ADC to identify unresolved bits in a raw digital output of the ADC. Bits that have been properly resolved by the ADC may be distinguished from those that have not been successfully resolved, because of time limitations or other reasons. Each bit that has not been successfully resolved may be classified and referred to as an unresolved bit. If there are any unresolved bits detected in a sampling cycle, dither may then be incorporated in the raw digital output to compensate for the unresolved bits in that cycle. The dither may be added to the raw digital output of the ADC to eliminate any missing codes in the processed digital output codes or the dither may be substituted for the unresolved bits in raw digital output to generate the processed digital output.

29 Claims, 9 Drawing Sheets

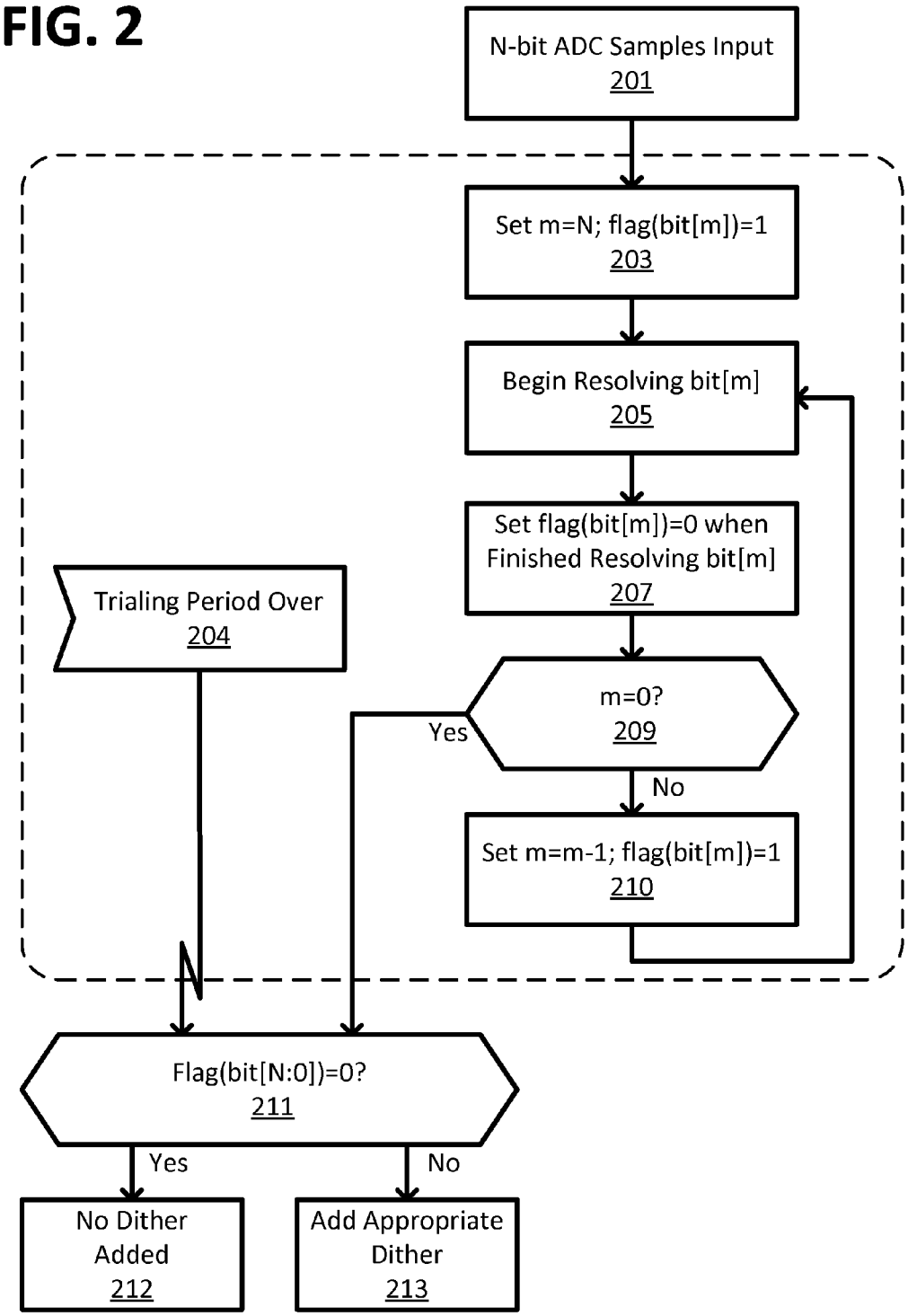

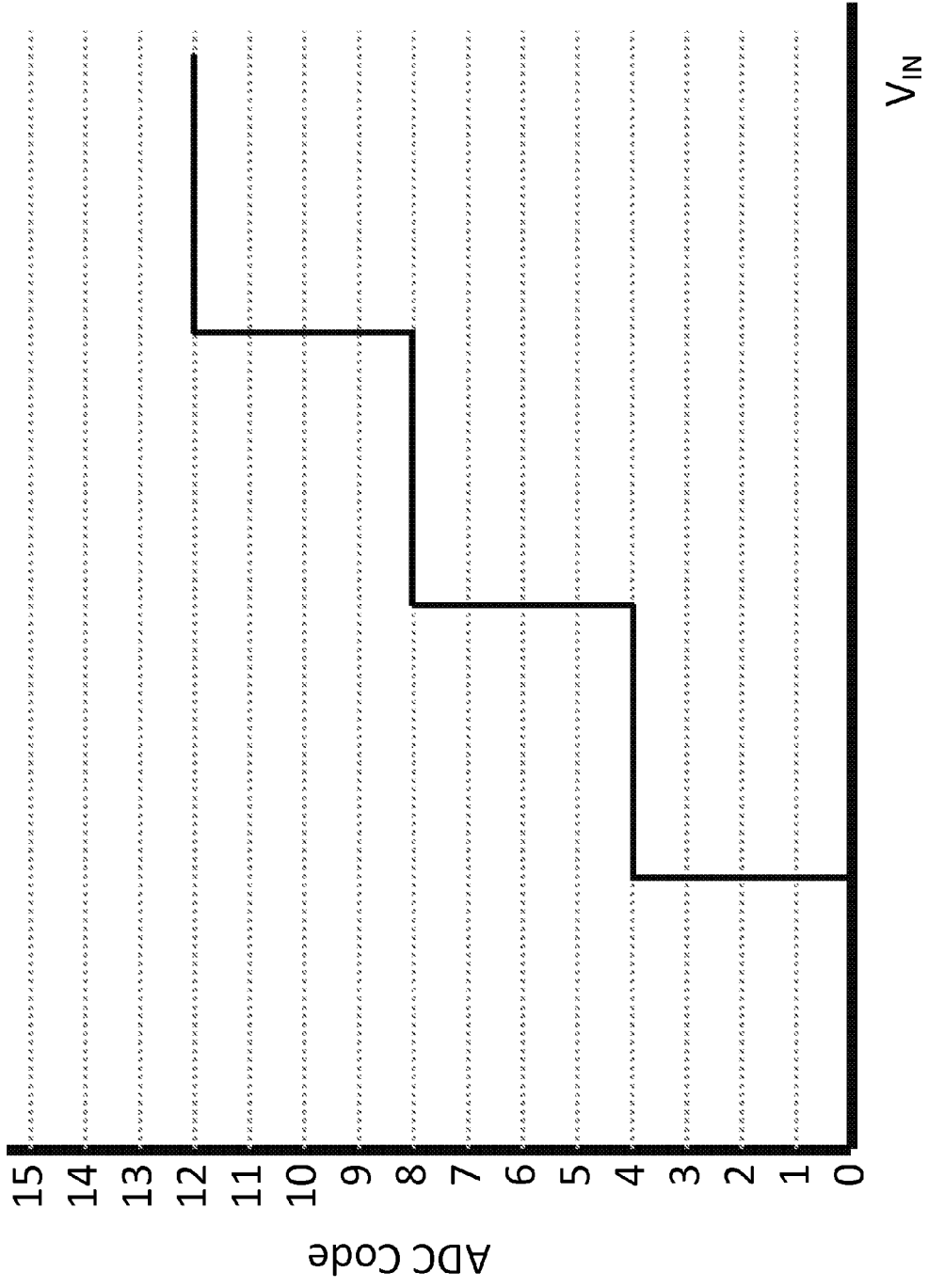

ADC WITH RESOLUTION DETECTOR AND VARIABLE DITHER

CROSS-REFERENCE TO RELATED APPLICATIONS

This application claims the benefit, under 35 U.S.C. §119 (e), of U.S. Provisional Patent Application No. 61/493,892, filed Jun. 6, 2011, the contents of which is hereby incorporated by reference in its entirety.

BACKGROUND

Analog to digital converters (ADCs) sample an analog signal and convert it into digital codes representing the signal's voltage. ADCs are typically driven by an external clock signal that controls the rate at which the sampling and conversion occurs. Typically, there is a trade off between clock speed and resolution; as the clock rate of the ADC is increased to accommodate higher bandwidth analog signals, the ADC has less time to convert new samples, which may lead to lower resolution.

This lower resolution may be caused by a lack of time needed to convert the analog sample into a full set of digital output bits. As the resolution and number of digital bits in the ADC output codes increase, the likelihood that the analog input signal will be closer to a digital code transition edge also increases. The amount of time needed to convert each bit may vary from bit to bit and cycle to cycle. For instance, more time may be required to resolve sampled signal values that are closer to transition edges. Each of these factors may affect the number of bits resolved in a given clock cycle.

Thus, as the clocking rate is increased in an ADC, the output resolution typically decreases. In some instances a clock rate may not provide the ADC with sufficient time to resolve a full set of digital output bits. In these instances, one or more of the least significant bits of the digital codes in a given sampling cycle may not be resolved and missing codes may result, as shown in FIG. 3A. Manufacturers may intentionally lower ADC clock rates to ensure that the ADC output does not include any missing code because the ADC had insufficient time to resolve the full set of digital output bits.

In some instances, such as in the conversion of analog image sensor data to digital codes, these missing codes may reduce the number of available colors represented in the digital codes. This may result in sharper and less smooth color transitions between different pixels. Additionally, in imaging systems, the noise threshold may increase as the level of detail captured by the image sensor increases. Thus, a larger image signal input may be able to support additional noise in the processed image without negatively affecting picture quality.

There is thus a need to operate ADCs at faster clock rates while reducing missing codes even if some bits do not get resolved.

BRIEF DESCRIPTION OF THE DRAWINGS

FIG. 2 shows an exemplary process in an embodiment of the invention.

FIG. 3A shows an exemplary correlation of $V_{IN}$ to output codes when the two LSBs are unresolved in every trial period, leading to missing codes.

DETAILED DESCRIPTION

Figure 1A:
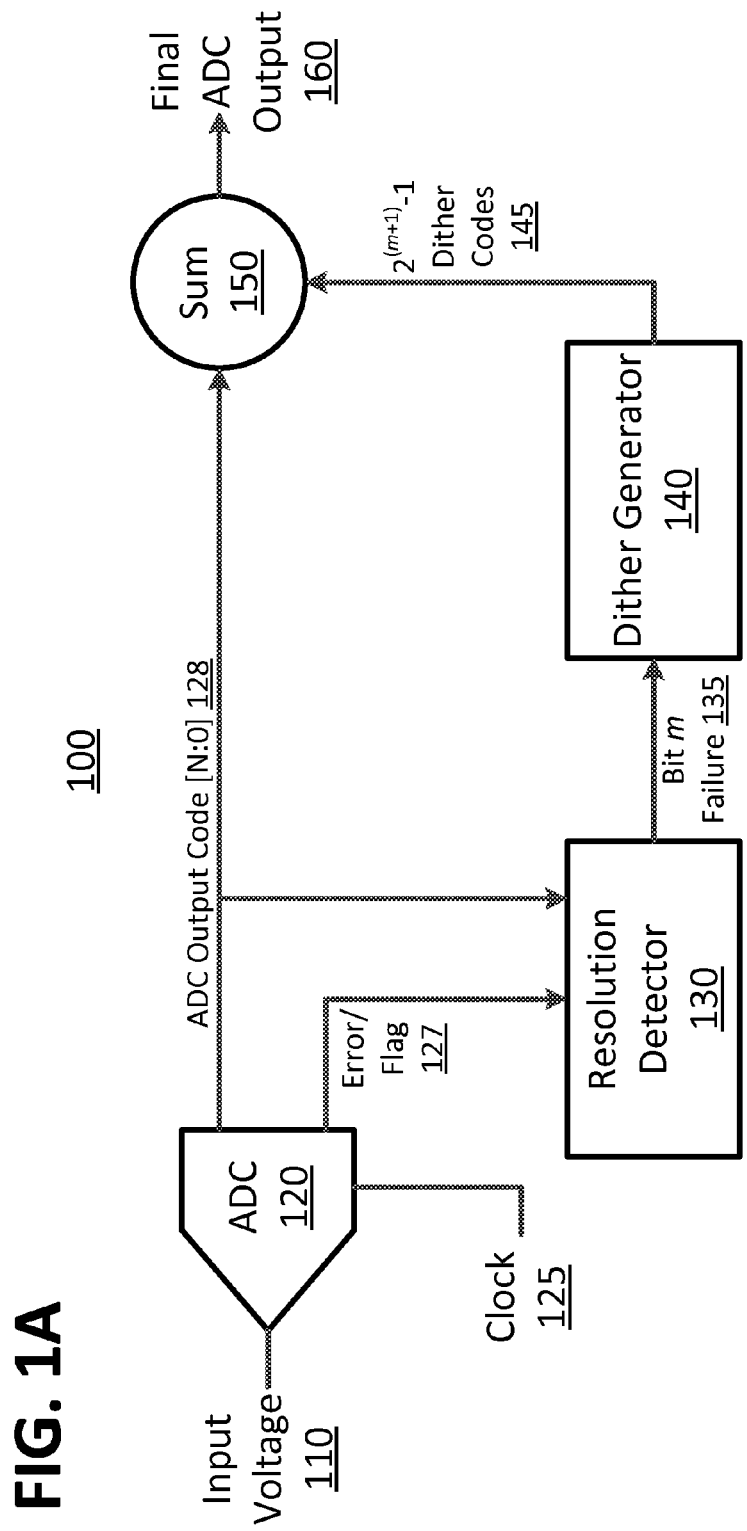
FIGS. 1A and 1B show two exemplary block diagrams in different embodiments of the invention.

In an embodiment, a resolution detector may be used to identify unresolved bits in a raw digital output of an ADC. The detector may distinguish between bits that have been properly resolved by the ADC and those bits that have not been successfully resolved, because of time limitations or other reasons. Each bit that has not been successfully resolved may be classified and referred to as an unresolved bit.

If there are any unresolved bits detected in a sampling cycle, dither may then be incorporated in the raw digital output to generate a processed digital output of the ADC accounting for the unresolved bits in that cycle. The dither may, for example, be added to the raw digital output of the ADC to eliminate any missing codes in the processed digital output codes or the dither may be substituted for the unresolved bits in the raw digital output to generate the processed digital output.

The magnitude of the dither may vary in proportion to the significance of the identified unresolved bits. For example, if bit m is unresolved by the ADC, then dither having a magnitude of at least $2^{\wedge}(m+1)-1$ ADC codes may be generated to account for this unresolved bit m. In some embodiments, the magnitude of the dither may be selected to exceed $2^{\wedge}(m+1)-1$ ADC codes. Selecting dither having a magnitude of at least $2^{\wedge}(m+1)-1$ ADC codes may ensure that the processed ADC output contains no missing codes given a sufficient sample size. If the magnitude of the dither is less than $2^{\wedge}(m+1)-1$ ADC codes, then at least one ADC code may still be missing from the processed ADC output irrespective of the sample size. The dither may include randomly generated or pseudo-randomly generated data. The dither may be selected to satisfy a particular distribution function, such as a uniform, Gaussian, triangle or other distribution function.

The significance of the unresolved bits may be determined by the resolution detector, which may identify the specific bit(s) in each cycle that remain unresolved. As discussed previously, dither may, for example, be added to the raw digital output of the ADC to fill-in any missing codes or be used as a replacement for the unresolved bit in the raw digital output to generate a final, processed ADC output.

Using both the resolution detector to identify unresolved bits and the dither to account for the unresolved bits as discussed above may enable N-bit linearity in an N-bit ADC operating at higher sampling speeds even though some of the N-bits may not be resolved. Furthermore, the dither may be selectively added solely to account for unresolved bits without affecting the ADC output codes of those bits properly resolved by the ADC.

The resolution detector also may detect bit errors. For example, in a differential SAR ADC, the ADC may output separate digital codes for each of two signal lines. Ideally, the output code applied to the positive side DAC should have the opposite polarity as that applied to the negative side DAC. Thus, if both DACs have the same code applied for a specific bit, an error may be presumed, and the bit may be flagged as unresolved.

The resolution detector also may detect bit errors in a flash ADC. For example, in a flash ADC, the ADC may output thermometer codes to identify resolved bits. The thermometer codes may include a bubble that may be caused by a static or dynamic comparator error in the ADC. For example, if an output code for a 3-bit flash ADC is '1011000', the resolution detector may detect that the leftmost '0' is erroneous, and that potentially the right most '1's are also erroneous. All of these bits may then be replaced with dither.

FIG. 1A shows a first exemplary block diagram 100 of an embodiment of the invention. An analog voltage 110 may be inputted to an N-bit ADC 120, which may be coupled to an external clock signal 125. A digital output 128 of the ADC 120 may be coupled to a summer circuit 150 which may combine the output of the ADC 128 with dither 145. A dither generator 140 may generate the dither 145 in response to a resolution detector 130 identifying a digital bit 135 in the raw ADC output 128 that failed to properly resolve.

The ADC 120 may also output a flag signal 127 or other indication of whether a bit was or was not properly resolved by the ADC 120. The flag signal 127 may be outputted by the ADC 120 if the ADC 120 did not have sufficient time to resolve a particular bit or if a bit was resolved incorrectly. The flag signal 127 along with the ADC code 128 may be sent to the resolution detector 130, which may be used to identify the specific bit in the raw ADC output that was not properly resolved.

Once the specific unresolved bit has been identified, the resolution detector 130 may send a failure signal 135 to the dither generator 140 to generate dither 145 proportional to the significance of the bit. For example, in an embodiment, if bit m is identified by the resolution detector 130 as unresolved, the dither generator may generate $2^{(m+1)}-1$ codes of dither 145. Different scaling and distribution functions may be used by the dither generator to generate dither. For example, a uniform, triangular, or Gaussian-type distribution function may be used.

Figure 1B:
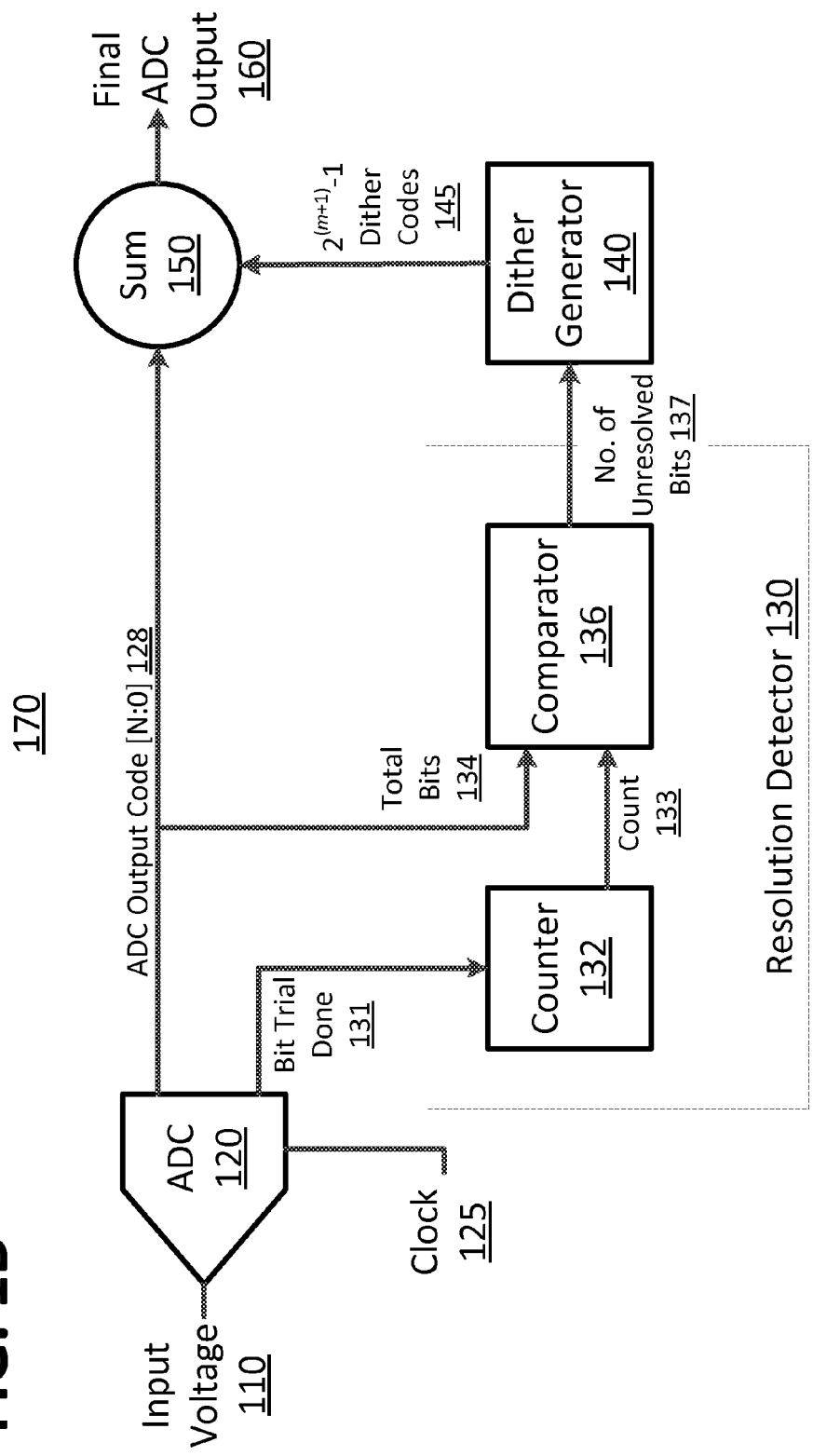

FIG. 1B shows a second exemplary block diagram 170 of an embodiment of the invention. In this example, the ADC 120 may output a bit resolution trial done signal 131 to a counter 132 each time a trial is completed and a bit is successfully resolved. In some instances, the flag signal 127 may also indicate whether a trial has successfully completed, and, in these instances, the flag signal 127 may also be used as the bit trial done signal 131. The counter 132, which may include a shift register or other counting circuitry, may count the number of successfully completed trials and output the count 133 to a comparator 136. The comparator 136 may compare the count 133 from counter 132 to a total expected number of bits 134 that should have been resolved if each of the trials completed successfully. In some instances, the total number of bits 134 may be calculated from the ADC output code 128, but in other instances the total number of bits 141 may be predetermined or obtained from a memory device or other source.

After comparing the count 133 from the counter 132 to the total number of bits 134, the comparator 136 may output a quantity of unresolved bits 137. The outputted number of unresolved bits 137 may then be used by the dither generator 140 to generate a corresponding number of the dither codes 145 that may be added 150 to the ADC raw output code 128. In some instances, the counter 132 and/or the comparator 136 may be included as part of the resolution detector 130, though in other instances they may be separate from the resolution detector 130.

The ADC 120 may resolve bits using parallel comparators. If the input signal is near a code step, one of the comparators may resolve more slowly than the rest, which may lead to varying signal conversion times. Each comparator may include a flag to indicate whether the comparator was able to complete its decision. If the comparator is not able to reach a decision in an allotted time, the digital bit may be replaced with dither or the dither may be added to the output codes 160.

FIG. 2 shows an exemplary process for identifying unresolved digital bits and determining whether to add dither in an embodiment of the invention using a successive approximation register (SAR) ADC. FIG. 2 represents one conversion cycle of the ADC. In box 201, an N-bit SAR ADC may begin sampling an analog signal to convert the signal into digital codes during a trialing period. For each trialing period the ADC may resolve the sampled signal into digital bits starting with a most significant bit and working down to a least significant bit.

In box 203, the resolution detector may set the variable m, which represents a bit counter, to the most significant bit N that the ADC is capable of resolving. An indicator, in this case a flag field for this most significant bit N, may then be set to indicate that the bit N has not yet successfully been resolved (in the figure, this is indicated with the exemplary value 1).

Box 204 may represent logic to determine whether the trial period for resolving the digital bits for a particular conversion cycle has ended. The logic may be configured to interrupt the process flow if the period allotted for resolving the bits in a given cycle has ended. Box 204, for example, shows an interruption in the bit resolution process (by redirecting the process to box 211) if the trialing period for resolving the bits has ended. This logic may be independent of the other processes, such as those shown in boxes 203, 205, and 207. This may enable the end of the trialing period to be triggered at any time independent of the bit resolution process. Once the end of the trialing period has been triggered, the process may immediately revert to box 211, to determine whether dither should be added, and if so, what magnitude the dither should be.

Once the flag field for this most significant bit N indicates that the bit N has not yet successfully been resolved (as in box 203), in box 205 the ADC may begin resolving bit N.

Once bit N has been successfully resolved, in box 207 the flag field may be changed accordingly (for example, in the figure, the flag is changed from a 1 to 0). If the trialing period ends before the bit is successfully resolved, the flag will not be changed and in box 213 an appropriate dither scaled for the bit N will be added.

In box 209, a determination may be made as to whether there are any remaining bits to be resolved. If no bits remain to be resolved, in box 211, all flag bits will be 0 in this instance to indicate that all bits were resolved. If there are remaining bits to be resolved at the end of the trial, in box 211, of those remaining unresolved bits, the most significant bit to be resolved may be selected to determine the size of the dither. The flag for this selected bit may also be set to indicate that the selected bit has not yet successfully been resolved, if this has not been done previously.

In box 205, the ADC may begin resolving the selected bit, and in box 207 the flag may be changed once the selected bit has been successfully resolved. In box 210, the flag for the next bit to be resolved may be set to 1 in this case to indicate that next bit has not yet been resolved. The process may then repeat until each of the bits has been resolved or until the trial period has ended.

Once all of the bits have been resolved or the trial period has ended, in box 211, the flag fields for each of the bits may be checked to determine whether all of the bits were successfully resolved.

If all of the bits were successfully resolved, in box 212 no dither may be added and the raw digital ADC output may represent the final and processed ADC output.

If at least one of the bits was not successfully resolved, in box 213 dither may be added. The dither may be scaled depending on the significance of the bits that were not successfully resolved. For example, in an embodiment, if bit m is identified by the resolution detector as unresolved, the dither generator may generate $2^{\wedge}(m+1)-1$ codes of dither. The dither may be added to the raw ADC output or the dither may be used as a replacement for the bits that did not properly resolve.

Figure 3B:
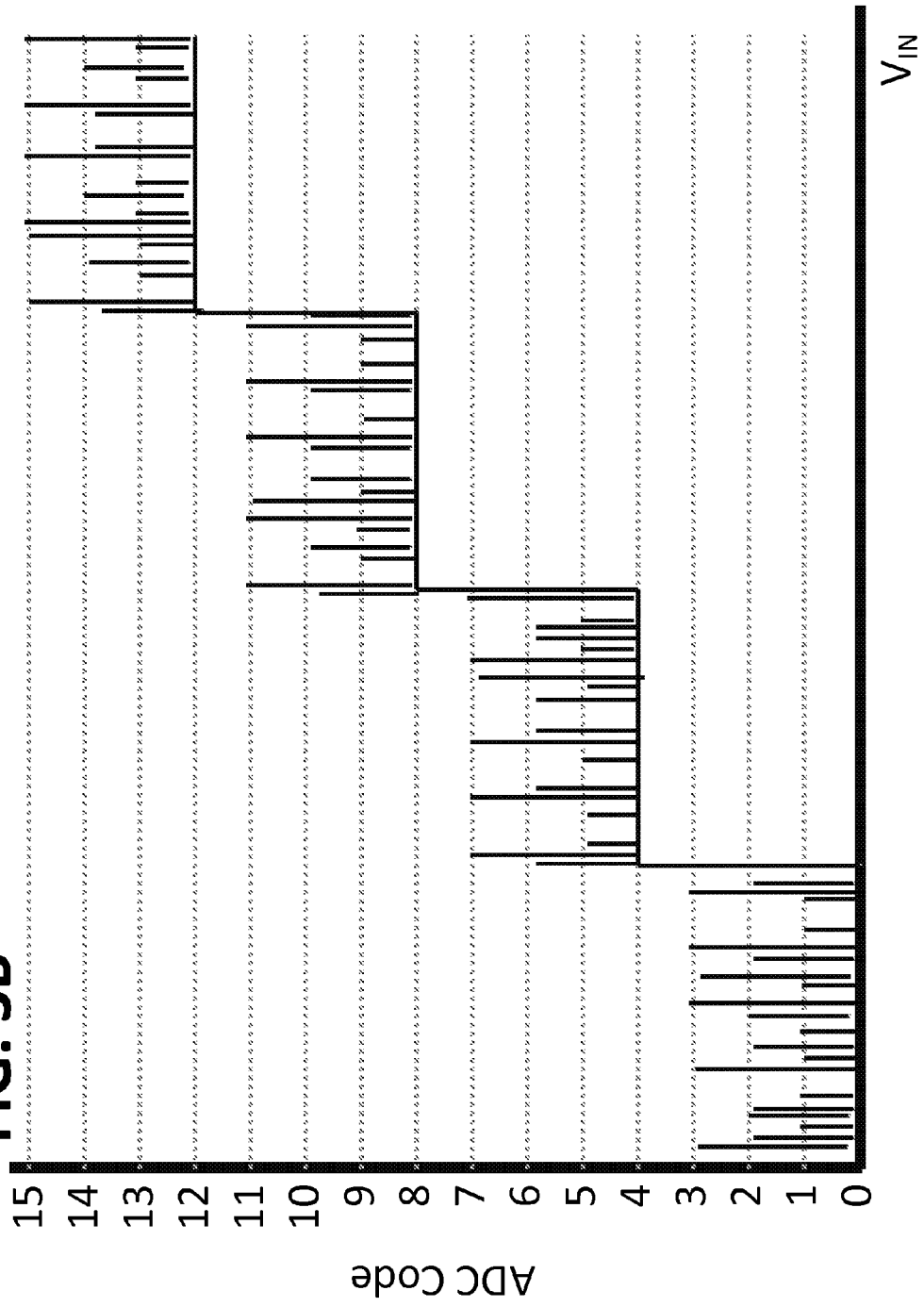
FIG. 3B shows an application of random dither in the use case of FIG. 3A.

FIG. 3A shows an exemplary correlation of $V_{IN}$ to 4-bit output codes when the two LSBs are unresolved in every trial period, leading to missing codes. FIG. 3B shows an application of random dither in the use case of FIG. 3A, eliminating the missing codes shown in FIG. 3A.

Because the two least significant bits were not able to be resolved, the raw digital output is limited to only four out of sixteen values (output codes 0, 4, 8, and 12), as shown in FIG. 3A. To correct this, a 2-bit uniform dither may be added to enable the full set of ADC codes to be generated as shown in FIG. 3B.

In practice, different conversion operations may cause the number of unresolved LSBs to vary. In some trial periods, the full set of ADC bits may be resolved and no bit may be unresolved. In other periods, different numbers of LSBs may be unresolved. As discussed previously, the likelihood and number of bits that may be unresolved may increase as the number of sampled values near decision points increases.

Figure 4:
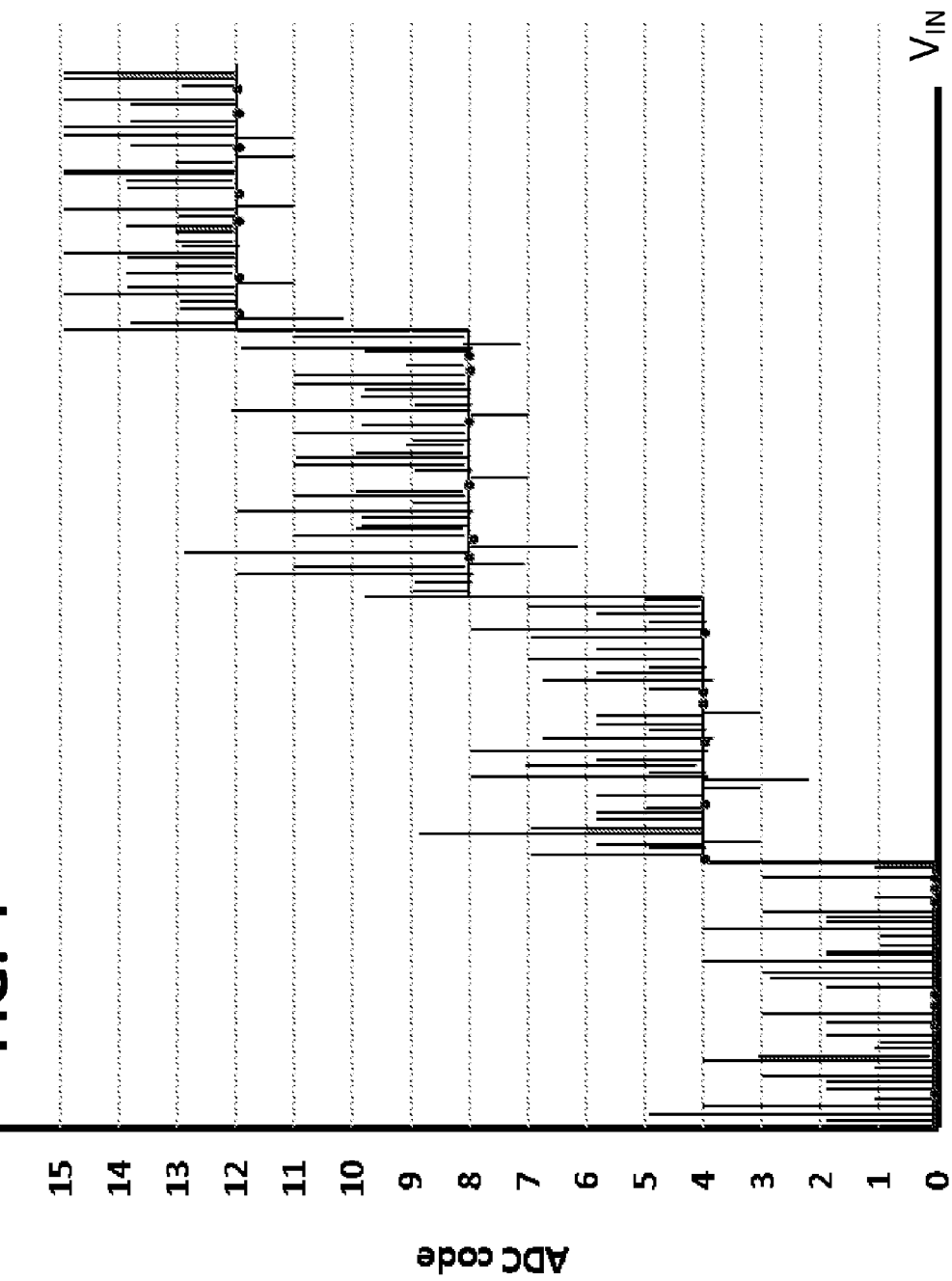
FIG. 4 shows a Gaussian-shaped dither added to the raw digital output shown in FIG. 3A in an embodiment.

In another embodiment, shown in FIG. 4, a Gaussian-shaped dither, which may be positive or negative, may be added to the raw digital output shown in FIG. 3A. As shown in the figure, the Gaussian dither may have a magnitude greater than that of the unresolved bits and missing codes. This may lead to smoother transitions between bigger code steps.

Figure 5A:
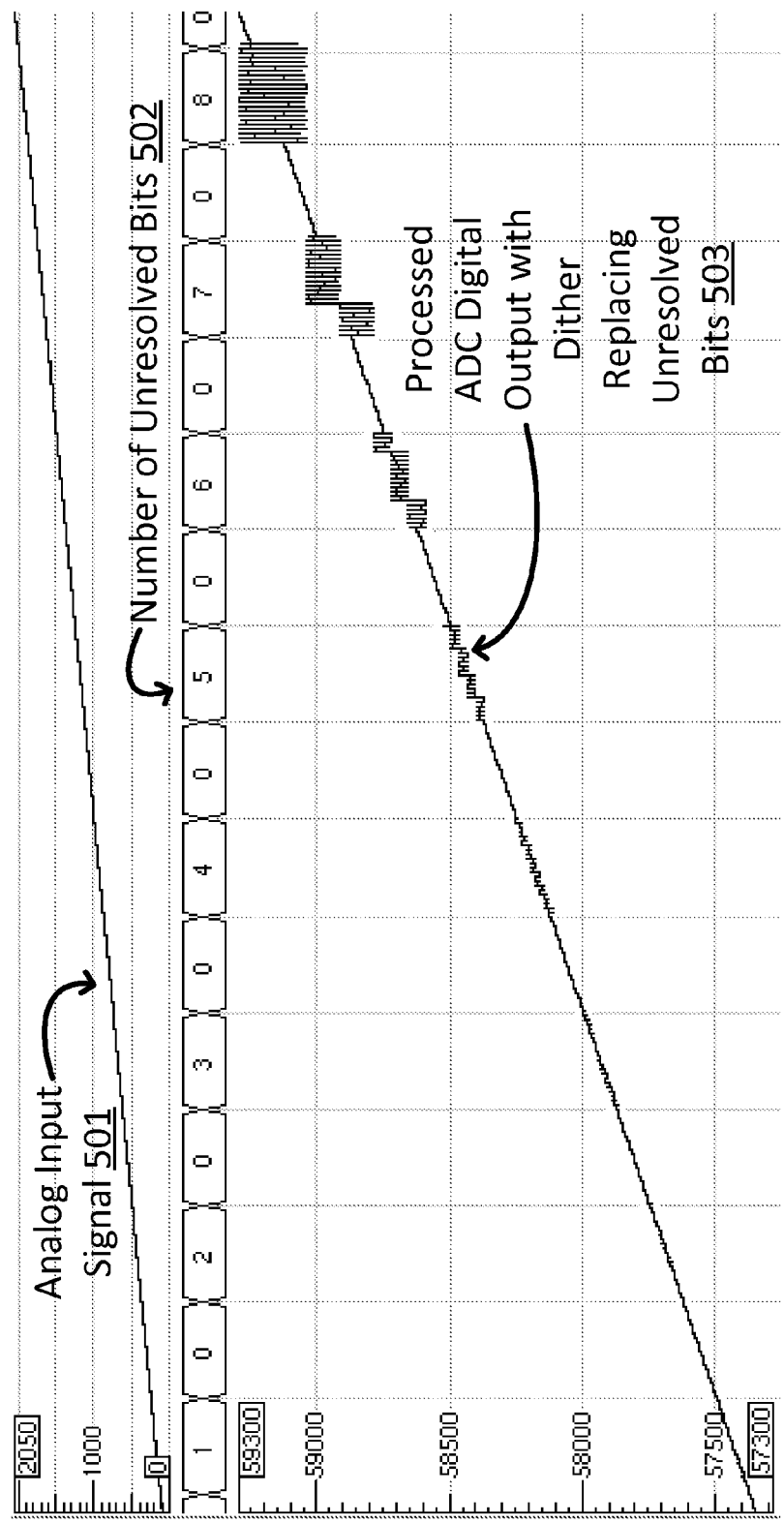
FIG. 5A shows an embodiment in which dither may be used to replace unresolved bits in a processed ADC output signal.

FIG. 5A shows an embodiment in which dither may be used to replace unresolved bits in a processed ADC output signal. As shown in FIG. 5A, an analog input signal 501 may be used as an input to an ADC in an embodiment. In this example, the ADC may be able to resolve a different number of bits for different sampling cycles. The figure shows the number of bits 502 that were not resolved in each set of 2000 sampling cycles. For example, as shown in the figure, in the first set of 2000 sampling cycles all bits were resolved, followed by one unresolved bit in the next set of 2000 sampling cycles, following by no unresolved bits in the next set of 2000 sampling cycles, followed by two unresolved bits, and so on. Although this figure shows a consistent number of unresolved bits in each set of 2000 sampling cycles, in many embodiments the number of unresolved bits may vary from one sampling cycle to the next.

In this example, the unresolved bits in each sampling cycle may be replaced with dither having a magnitude proportional to the significance of the greatest unresolved bit, such as according to the function $2^{\wedge}(m+1)-1$ where bit m is the most significant unresolved bit. The processed output 503 may include raw ADC output combined with the dither replacing the unresolved bits. As shown in the output 503, as the number of unresolved bits increases from 1 to 8, the magnitude of the dither added to replace the unresolved bits also increases. Thus different segments of the processed ADC output 503 may include no dither (when all bits were successfully resolved) or may include dither proportional to the number of unresolved bits (when at least one bit remains unresolved).

Figure 5B:
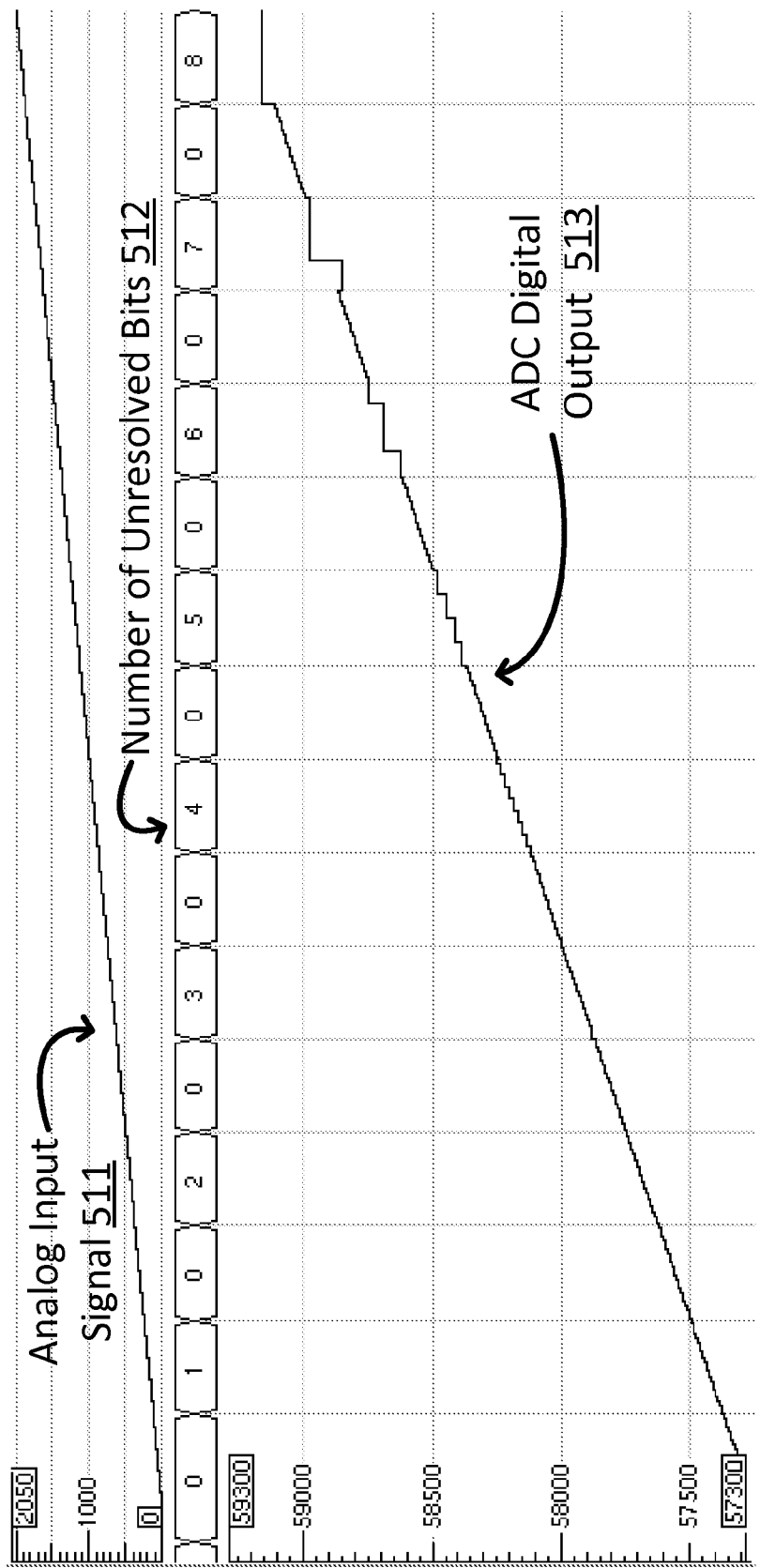
FIG. 5B shows, based on the input used in FIG. 5A, an exemplary output in which dither is not used.

As a comparison, FIG. 5B shows an exemplary digital output 513 of an ADC having the same input signal 511 and unresolved bits 512 as in FIG. 5A, but to which no dither was added. As shown in FIG. 5B, the number of missing codes increases with the number of unresolved bits.

Figure 6:
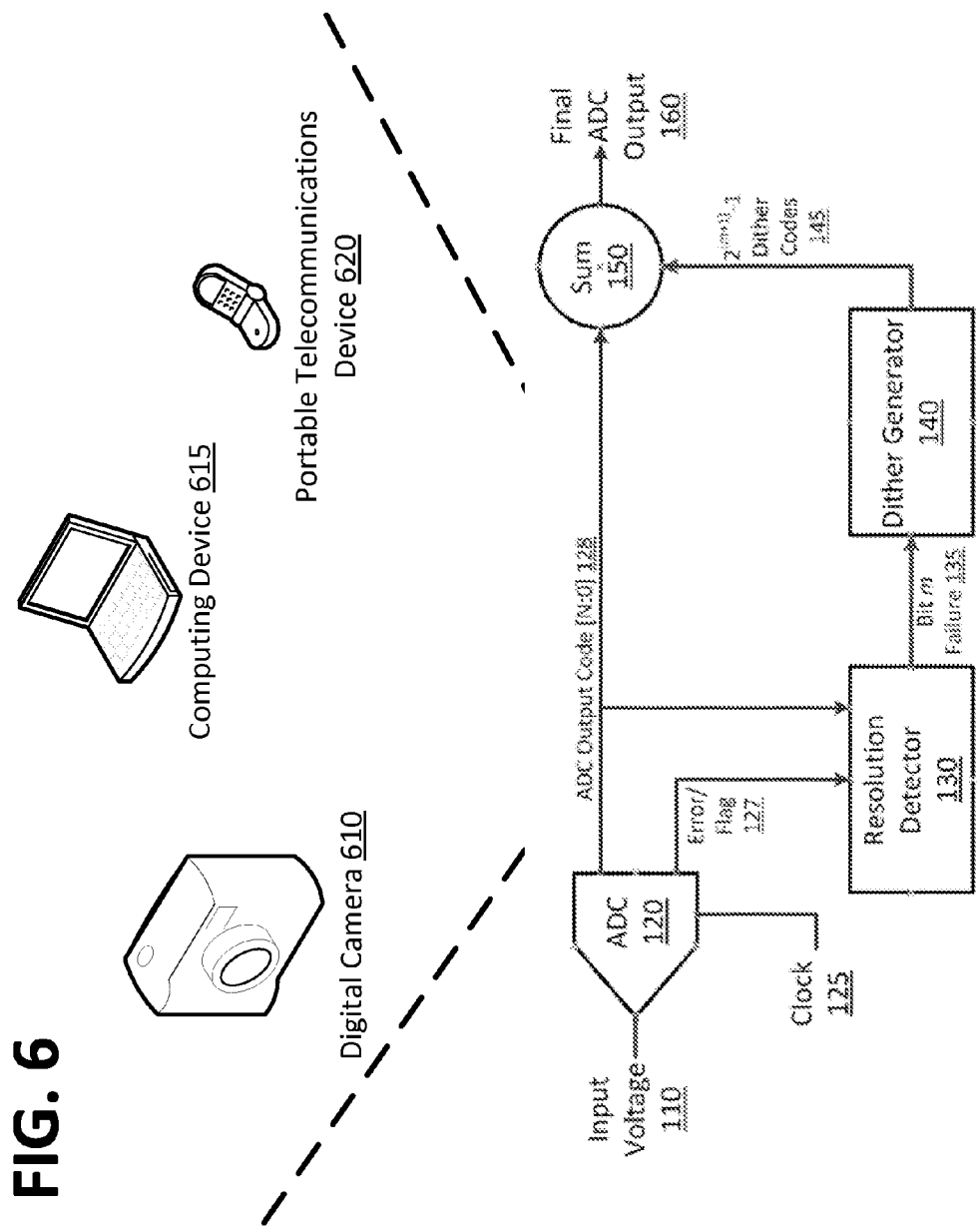
FIG. 6 shows exemplary devices in which embodiments of the invention may be used.

FIG. 6 shows exemplary devices in which embodiments of the invention may be used. For example, embodiments of the invention may be used in devices that process analog signals obtained from image capturing devices. These processing devices may include digital cameras 610, computing devices 620, and telecommunication devices 630, each of which may process analog signal obtained from an image sensor or other source. Digital camera devices 610 may include both still and video cameras.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention. For example, some of the described embodiments may add generated dither codes to an output of the ADC to generate a final ADC output signal, but in other embodiments, a generate dither may be added to the ADC output in place of the missing bits. In other embodiments, the dither generator may store a number of previous samples, which may be averaged and used to add a similar dither when subsequent lost bits are detected. In some embodiments dither that is added in the ADC output may include negative and/or positive values.

We claim:

1. A method comprising:
   identifying an unresolved portion of an output code from an analog to digital converter (ADC); and
   adding dither in the ADC output code to compensate for the unresolved code portion.

2. The method of claim 1, wherein the unresolved portion of the output code is a portion of the output code that is not resolved.

3. The method of claim 1, wherein the unresolved portion of the output code is a portion of the output code that is incorrectly resolved.

4. The method of claim 1, wherein a magnitude of the dither included in the ADC output is proportional to a significance of the unresolved code portion.

5. The method of claim 4, wherein the magnitude of the dither is selected to encompass at least each unresolveable code value in the unresolved code portion.

6. The method of claim 1, wherein the dither is only added to compensate for the unresolved code portion without affecting the output code of a properly resolved portion.

7. The method of claim 1, wherein the unresolved code portion is replaced with the dither to add the dither in the ADC output.

8. The method of claim 1, further comprising generating the dither added in the ADC output.

9. The method of claim 8, wherein the dither is pseudo-randomly generated.

10. The method of claim 8, wherein the dither is generated according to a distribution function.

11. The method of claim 10, wherein the distribution function is a Gaussian distribution function.

12. The method of claim 10, wherein the distribution function is a uniform distribution function.

13. The method of claim 10, wherein the distribution function is a triangle distribution function.

14. The method of claim 8, wherein the generated dither has a magnitude of at least $(2^{(m+1)}-1)$ ADC codes, m representing a significance of an unresolved bit in the unresolved code portion.

15. The method of claim 1, further comprising setting a flag to a first value when starting to resolve a bit and setting the flag to a second value when finished resolving the bit to identify the unresolved portion of the output code.

16. The method of claim 15, further comprising identifying a significance of the bit being resolved to identify the unresolved portion of the output code.

17. The method of claim 1, further comprising:
supplying an analog image signal from an image capturing device to the ADC; and
generating a digital image output from the ADC output having the added dither to compensate for the unresolved code portion.

18. A circuit comprising:
an analog to digital converter (ADC) to convert an analog signal into digital code;
a resolution detection arrangement to identify an unresolved bit in an output of the ADC; and
a dither arrangement to include dither in the ADC output to compensate for the unresolved bit.

19. The circuit of claim 18, wherein the resolution detection arrangement identifies a significance of the unresolved bit and the dither arrangement generates the dither proportional to the identified significance of the unresolved bit.

20. The circuit of claim 18, wherein the resolution detection arrangement includes a counter to count a number of resolved bits and a comparator to compare the counted number of resolved bits and a total number of bits and calculate a quantity of unresolved bits to identify the unresolved bit.

21. The circuit of claim 18, wherein the dither arrangement adds the dither to the ADC output to include the dither in the ADC output.

22. The circuit of claim 18, wherein the dither arrangement replaces the unresolved bit in the ADC output with the dither to include the dither in the ADC output.

23. The circuit of claim 18, wherein the resolution detection arrangement compares true and complement control signals in a differential successive approximation register (SAR) ADC and designates corresponding bits in the true and the complement control signals having non-opposite polarity as unresolved bits.

24. The circuit of claim 18, wherein the resolution detection arrangement identifies a bubble in a thermometer code output of a flash ADC and designates a bit associated with the bubble as the unresolved bit.

25. The circuit of claim 18, wherein the ADC sends a bit resolution status signal to the resolution detection arrangement from which the resolution detection arrangement identifies the unresolved bit.

26. The circuit of claim 18, wherein the resolution detection arrangement sends a signal to the dither arrangement to include a dither proportional to a significance of the unresolved bit.

27. The circuit of claim 18, further comprising an image capturing device, wherein the image capturing device supplies an analog image signal to the ADC and the ADC, the resolution detection arrangement, and the dither arrangement generate a digital image output.

28. The circuit of claim 27, wherein the image capturing device is a digital camera.

29. The circuit of claim 27, wherein the image capturing device is included in a computing device.

* * * * *